United States Patent
Akamatsu et al.

(10) Patent No.: US 6,340,525 B1
(45) Date of Patent: Jan. 22, 2002

(54) NON-CRIMPING POLYESTER MONOFILAMENT AND PROCESS FOR PRODUCING SAME

(75) Inventors: Tetsuya Akamatsu, Ibaraki; Chiaki Tashiro, Matsuyama, both of (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 09/763,471
(22) PCT Filed: Jun. 23, 2000
(86) PCT No.: PCT/JP00/04157
  § 371 Date: Feb. 23, 2001
  § 102(e) Date: Feb. 23, 2001
(87) PCT Pub. No.: WO01/00911
  PCT Pub. Date: Jan. 4, 2001

(30) Foreign Application Priority Data

Jun. 24, 1999 (JP) ............................................. 11-178111

(51) Int. Cl.⁷ ................................ D01F 6/00; D01P 6/62
(52) U.S. Cl. ........................ 428/364; 428/395; 264/291
(58) Field of Search ................................ 428/364, 370, 428/373, 374, 395; 264/172.17, 291

(56) References Cited

U.S. PATENT DOCUMENTS 3,940,543 A * 2/1976 Chimura et al. ............ 428/373

FOREIGN PATENT DOCUMENTS

| EP | 0 201 114 | 3/1986 | ............. D01F/6/62 |
|----|-----------|--------|------------------------|
| JP | 55-16948  | 2/1980 | ............. D01F/6/62 |
| JP | 1-132829  | 5/1989 | ............. D01F/8/14 |
| JP | 2/289120  | 11/1990 | ............ D01F/8/14 |

* cited by examiner

Primary Examiner—Newton Edwards
(74) Attorney, Agent, or Firm—Sughrue Mion, PLLC

(57) ABSTRACT

A non-crimping polyester monofilament having an excellent resistance to abrasion and satisfactory mechanical strength and modulus has a intrinsic viscosity distribution such that the farther the location of a part of the monofilament from the longitudinal axis of the monofilament, the lower the intrinsic viscosity of a portion of polyester resin located in the part of the monofilament, wherein a peripheral part of the monofilament formed from a portion of the polyester resin having a lowest average intrinsic viscosity of 0.6 to 1.1 and concentrically surrounds a center part of the monofilament formed from another portion of the polyester resin having a highest average intrinsic viscosity, and the intrinsic viscosities the polyester resin portions for the peripheral and center parts of the monofilament is controlled by controlling the heat history of each of the portions of the polyester resin in a melt spinneret for producing the monofilament.

28 Claims, 4 Drawing Sheets

NON-CRIMPING POLYESTER MONOFILAMENT AND PROCESS FOR PRODUCING SAME

TECHNICAL FIELD

The present invention relates to a non-crimping polyester monofilament and a process for producing the same. More particularly, the present invention relates to a non-crimping polyester monofilament having an improved surface property and usable as a material monofilament, for ropes, nets, artificial gut, tarpaulins, tents, screens, paragliders and sailcloths, particularly for producing mesh woven fabrics for screen-printing, especially high-mesh high-modulus plain gauzes for screen printing which are required to have a high accuracy, in the production of base plates for printed circuits.

BACKGROUND ART

Polyester monofilaments, which may be referred to "monofilaments" or "material yarns", are widely employed not only in the clothing field but also in the industrial material field. Particularly, in the industrial material field, the polyester monofilaments are used as material yarns for tire cords, ropes, nets, gut, tarpaulins, tents, screens, paragliders, and sailcloths. The monofilaments for the industrial material use must satisfy severe requirements in adhesive property to rubber, fatigue resistance, dyeability, wear resistance and knot strength.

The requirements in physical properties for the monofilaments has become more and more severe and improvements in rubber-adhesion, fatigue resistance, dyeing property, wear resistance and knot strength of the monofilaments is strongly required.

Particularly, the polyester monofilaments have excellent dimensional stability and thus, in the field of the material yarns for plain gauzes for screen printing, the polyester monofilaments now replace the natural filaments, for example, silk filaments and inorganic filaments, for example, stainless steel filaments.

In the field of the circuit printing for electronic devices, for example, base plates of printed circuits, the degree of integration of the printed circuits is further increased, and thus the accuracy of the circuit printing by the screen printing is strongly required to be increased. Namely, the printing screen for the circuit printing is required to has further increased mesh degree, mechanical strength and modulus. Therefore, the material yarns for the printing screen are required to have further enhanced mechanical strength and modulus and a further decreased thickness. Generally, it is well known that, to increase the mechanical strength and the modulus of the polyester monofilaments, melt-spun, undrawn polyester monofilament is heat-drawn at a high draw ratio to orientate and crystallize the polyester molecules in the monofilament to a great extent.

However, in the procedure for producing the printing screen, the polyester monofilaments are woven into a high density woven fabric to meet with the above-mentioned requirement of a high mesh fabric. In this weaving procedure, the polyester monofilaments are subjected to repeated severe abrasions with a reed of the weaving machine (loom).

Therefore, a portion of the periphery of the monofilament is worn out and fluff or powder-like scum is generated in the weaving machine. Thus the productivity of the printing screen is decreased and the quality of the product is degraded. Also, it is known that the higher the orientation degree and the crystallization degree of the polyester monofilament, the severer the above-mentioned problems in the weaving procedure. When the scums are accumulated in the weaving machine, the weaving procedure is stopped, and when woven printing screen is contaminated with the scum, the contaminating scum causes printing defects to be generated on the printed products in a precision printing procedure.

To prevent or restrict the generation of the scum in the weaving procedure, for example, Japanese Unexamined Patent Publication No. 55-16,948 proposes to employ, as warp yarns, stretch polyester filament yarns having an ultimate elongation of 30 to 60%. However, the high stretch yarns usually have a low modulus and thus cannot meet the requirement of high-strength and high-modulus for the material yarns for the printing screens.

As mentioned above, a high draw ratio is necessary to obtain the high-strength high-modulus polyester monofilament. However, the high draw ratio causes a portion of the polyester resin located in a peripheral part of the resultant drawn polyester monofilament to have a higher degree of orientation of the polyester molecules than that of another portion of the polyester resin located in a center part of the monofilament, and thus the peripheral part of the monofilament is easily partially worn out by abrasion. To solve this problem, there are various proportions of forming the peripheral part of the monofilament by a polymeric melt different from conventional one, to realize both the production of high strength high modulus monofilament and the prevention of scum generation during the weaving prodcedure.

For example, Japanese Unexamined Patent Publication No. 1-132,829 discloses a core-in-sheath type monofilament comprising a core part formed from a polyester and a sheath part formed from a nylon. This core-in-sheath type monofilament has a high mechanical strength and exhibits a high restriction effect on scum generation. However, in this type of monofilament, the sheath part exhibits a high moisture absorption due to the coherent property of nylon and this high moisture absorption of the sheath portion disadvantageously causes the monofilament to exhibit, as a whole, a reduced dimensional stability. Further, since the monofilament is constituted from a polyester sheath part and a nylon core part and polyester and nylon are uncompatible with each other, when the monofilament is repeatedly fatigued under stress during printing procedures the polyester sheath part and the nylon core part may easily separate, at the interface therebetween, from each other.

To solve the above-mentioned problem, Japanese Unexamined Patent Publication No. 2-289,120 provides a core-in-sheath type monofilament having a core part formed from a polyester homopolymer having an intrinsic viscosity of 0.80 and a sheath part formed from a polyethylene glycol-copolymerized polyester having an intrinsic viscosity of 0.67. In the core-in-sheath type composite monofilament, the wearing out of the monofilament due to contact and friction with reed and heald of a weaving machine occurs at the peripheral part of the monofilament. Therefore, the above-mentioned core-in-sheath type monofilament is characterized in that the peripheral part of the monofilament is formed from a polyester copolymer having a low glass transition temperature and exhibiting high resistance to friction and abrasion. Therefore, the strength and modulus of the core-in-sheath type monofilament depend mainly on those of the core part formed from the polyester homopolymer. Thus, in view point of the mechanical properties of the monofilament, it is advantageous that the sheath part formed from the polyester copolymer has a small thickness, in other words, in the cross-section of the monofilament, the ratio of the cross-sectional area of the sheath part to the total cross-sectional area of the monofilament is kept low. However, when the thickness of the sheath part of the monofilament is too low, the core part of the monofilament may be partially exposed to the outside and, simultaneously, since the compatibility of the polyester copolymer for the sheath part with the polyester homopolymer for the core part is low, separation of the sheath part from the core part at the interface therebetween unavoidably occurs. This phenomenon causes the scum-restriction effect of the monofilament and the physical properties and functions of the monofilament to be degraded.

For example, in core-in-sheath type monofilaments for plain gauze for printing screen available in the trade in 1998, the cross-sectional proportion of the sheath part is 30 to 40% which is higher than the range proposed in the above-mentioned Japanese unexamined patent publication.

DISCLOSURE OF THE INVENTION

An object of the present invention is to provide a non-crimping polyester monofilament having a high mechanical strength, a high modulus and a high resistance of a peripheral part thereof to abrasion and capable of having a small thickness, and a process for producing the same with a high efficiency.

Another object of the present invention is to provide a non-crimping polyester monofilament having a high resistance of a peripheral part thereof to abrasion in a weaving procedure, useful for producing plain guaze for precision printing screen having a high mesh, a high mechanical strength and a high modulus, and capable of being formed with a very small thickness, and a process for producing the same with a high efficiency.

The above-mentioned object can be attained by the polyester monofilament of the present invention and the process of the present invention for producing the same.

The non-crimping polyester monofilament of the present invention is formed from a polyester resin, and in the monofilament, the polyester resin has an intrinsic viscosity which varies in distribution in such a manner that the farther the location of a part of the monofilament from the longitudinal axis of the monofilament in the direction at right angles to the longitudinal axis, the lower the intrinsic viscosity of a portion of the polyester resin located in the part of the monofilament, and a portion of the polyester resin located in a peripheral part (p) of the monofilament has an average intrinsic viscosity $[\eta]f$–p of 0.6 to 1.1, determined in orthochlorophenol at a temperature of 35° C., the peripheral part (p) concentrically surrounding a center part (c) of the monofilament extending along the longitudinal axis of the monofilament.

The process of the present invention for producing a non-crimping polyester monofilament, comprises:

melting a polyester resin having an intrinsic viscosity of 0.8 to 1.3, determined in o-chlorophenol at a temperature of 35° C.;

dividing the polyester resin melt into at least two portions;

passing the polyester resin melt portions through at least two passages which cause the intrinsic viscosity of the polyester resin melt portions to be decreased to extents different from each other;

extruding the polyester resin melt portions which are different, from each other, in the intrinsic viscosities thereof, through a melt-spinning orifice, in such a manner that a polyester resin melt portion having a highest intrinsic viscosity is extruded through a center part of the orifice, and a polyester resin melt portion having a lowest intrinsic viscosity is extruded through a peripheral part concentrically surrounding the center part of the orifice, to form a filamentary stream of the polyester resin melt;

drafting and solidifying the resultant filamentary stream of the polyester resin melt to form a monofilament of the polyester resin;

taking up the drafted and solidified polyester monofilament; and heat-drawing the taken-up undrawn monofilament, wherein during the extruding step through the heat-drawing step, the polyester resin portions different in intrinsic viscosity from each other are diffused, at the interface portion thereof, into each other, to cause the resultant monofilament to have a distribution of the intrinsic viscosity of the polyester resin such that the farther the location of a part of the monofilament from the longitudinal axis of the monofilament in the direction at right angles to the longitudinal axis, the lower the intrinsic viscosity of a portion of the polyester resin located in the part of the monofilament, and a portion of the polyester resin located in the peripheral part of the monofilament has an average intrinsic viscosity $[\eta]f$–p of 0.6 to 1.1 determined in o-chlorophenol at a temperature of 35° C.

BEST MODE OF CARRYING OUT THE INVENTION

Figure 1:
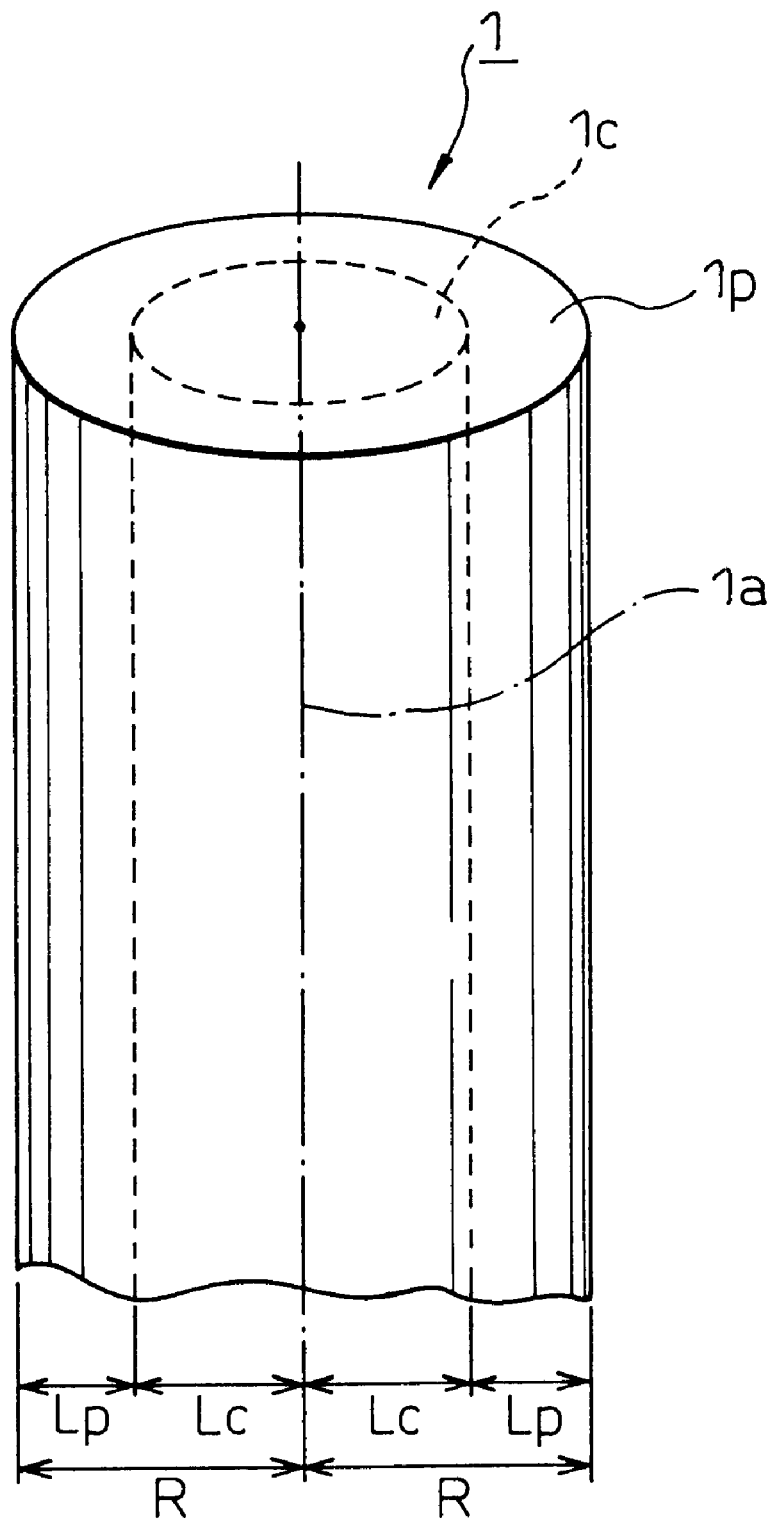
FIG. 1 is a schematic explanatory view of a polyester monofilament of the present invention having a center part (c) and a peripheral part (p) concentrically surrounding the center part (c)

In the present invention, a non-crimping polyester monofilament having a high resistance, at a peripheral part thereof, to abrasion and satisfactory mechanical strength and modulus can be obtained by utilizing a reduction in intrinsic viscosity of the polyester resin such that when a melt of a polyester resin is fed into a melt-spinneret, passed through the spinneret and extruded from the spinneret, the intrinsic viscosity of the polyester resin melt is reduced in response to heat history of the polyester resin melt passed in the spinneret, namely the higher the temperature of the spinneret and the longer the staying time of the polyester resin melt in the spinneret, the larger the reduction in the intrinsic viscosity of the polyester resin melt.

The polyester monofilament of the present invention has an improved surface (periphery) property. Namely, in the polyester monofilament of the present invention, the peripheral part thereof exhibits improved properties, for example, abrasion resistance to metallic materials, for example, reed, roller and yarn guide of weaving machine, adhesive property to rubber, fatigue resistance, dyeing property, abrasion resistance and knot resistance, in comparison with those of the center part of the monofilament.

The polyester monofilament of the present invention preferably has an average stress of 29.4 mN or more per 0.9 dtex (3 g/denier or more) under an elongation of 5%, an average tensile strenght of 58.4 mN or more per 0.9 dtex and an average ultimate elongation of 10 to 30%, which are satisfactory for practical use of the polyester monofilament.

In the production of a polyester multifilament, a melt of polyester resin is passed through a filtering layer arranged immediately above a melt spinneret having a plurality of melt-spinning orifices under a high pressure. In this filtering procedure, a portion of the polyester resin melt passed through a center part of the filtering layer and another portion of the melt passed through an outer portion of the filtering layer are different in staying time, from the filtering layer to the spinning orifice, from each other. Namely, the portion of the melt passed through the outer portion of the filtering layer has a longer staying time than that of the portion of the melt passed through the center part, and thus is heat-decomposed to a higher extent and has a lower intrinsic viscosity than that of the portion of the melt passed through the center part of the filtering layer.

When the polyester resin melt is extruded through the plurality of orifices, the filaments formed from the polyester resin melt portion passed through the center part of the filtering layer have a higher intrinsic viscosity, and other filaments formed from the polyester resin melt portion passed through the outer part of the filtering layer have a lower intrinsic viscosity. Thus, the resultant multifilaments are uneven in the physical properties thereof.

Many attempts have been made to make the intrinsic viscosity of the polyester resin melt portions located immediately upstream to the spinning orifices even. For example, in one attempt, a rectification plate or a static mixer is arranged immediately below the filtering layer to uniformly knead-mix the filtered melt portions of the polyester resin and to introduce a polyester resin melt having uniform intrinsic viscosity to the melt-spinning orifices for the multifilaments.

In the present invention, contrary to the above-mentioned prior art, the melt portions of a polyester resin different in intrinsic viscosity from each other are utilized to produce a non-crimping polyester monofilament having a desired surface property, without uniformalizing them. Namely, in the present invention, a center part of the monofilament is formed from a portion of the polyester resin melt having a highest intrinsic viscosity, a peripheral portion of the monofilament is formed from another portion of the polyester resin melt having a lowest intrinsic viscosity, and optionally an intermediate part between the center part and the peripheral part of the monofilament is formed from still another portion of the polyester resin melt having an intermediate intrinsic viscosity between the highest and the lowest intrinsic viscosities.

In the polyester monofilament of the present invention, the intrinsic viscosity of the polyester resin varies in such a manner that the farther the location of a part of the monofilament from the longitudinal axis of the monofilament in the direction at right angles to the longitudinal axis, the lower the intrinsic viscosity of a portion of the polyester resin located in the part of the monofilament. In other words, the intrinsic viscosity of the polyester resin decreases with an increase in a distance from the longitudinal axis of the monofilament measured in the direction at right angles to the longitudinal axis.

In the polyester monofilament of the present invention, the peripheral part concentrically surrounds the center part of the monofilament extending along the longitudinal axis, and thus the resultant monofilament of the present invention has no self-crimping property.

The peripheral part of the monofilament of the present invention has an average intrinsic viscosity $[\eta]f\text{-}p$ of 0.6 to 1.1, preferably 0.6 to 0.9, determined in orthochlorophenol at a temperature of 35° C.

In our research, it was confirmed that with respect to a polyester monofilament having an average intrinsic viscosity $[\eta]f\text{-}a$ of the polyester resin of 0.65 to 0.85, an ultimate elongation of 20 to 40%, a tensile strength of 58.8 to 83.4 mN per 0.9 dtex (1.0 denier) (6.0 to 8.5 g/denier), provided that the monofilaments were produced under the same production conditions, a reduction of the intrinsic viscosity of the polyester resin is in an extent of 0.01, causes the tensile strength of the resultant polyester monofilaments to decrease in an extent of about 1.96 mN per 0.9 dtex (about 0.2 g/denier), and the ultimate elongation of the resultant polyester monofilaments to increase in an extent of about 1.5%. From this fact, it was expected that when, in a production of a polyester monofilament, a center part of a monofilament is formed from a portion of a polyester resin melt which had a low reduction in intrinsic viscosity generated during a melt spinning procedure and a peripheral part of the monofilament is formed from a portion of a polyester resin melt which had a high reduction in intrinsic viscosity generated during the melt spinning procedure, the resultant polyester monofilament has a peripheral part thereof having a high ultimate elongation and a low modulus in comparison with those of other parts of the monofilaments, and a center part of the monofilament having a satisfactory mechanical strength and modulus.

The present invention will be further explained by referring to the drawings.

FIG. 1 is a schematic explanatory view of a polyester monofilament of the present invention having a circular cross-sectional profile. In FIG. 1, a polyester monofilament 1 extends along a longitudinal axis $1a$ thereof and has a center part $1c$ surrounding the longitudinal axis $1a$ and a peripheral part $1p$ concentrically surrounding the center part $1c$. In a cross-section of the monofilament 1, the monofilament 1 has a radius R, the radius of the center part $1c$ is represented by Lc and the thickness of the peripheral part $1p$ determined along the radium R of the monofilament 1 is represented by Lp. Namely Lc+Lp=R. Since, the center part $1c$ and the peripheral part $1p$ are in a concentric relationship with each other, the monofilament exhibits, as a whole, a non-crimping property.

Figure 2:
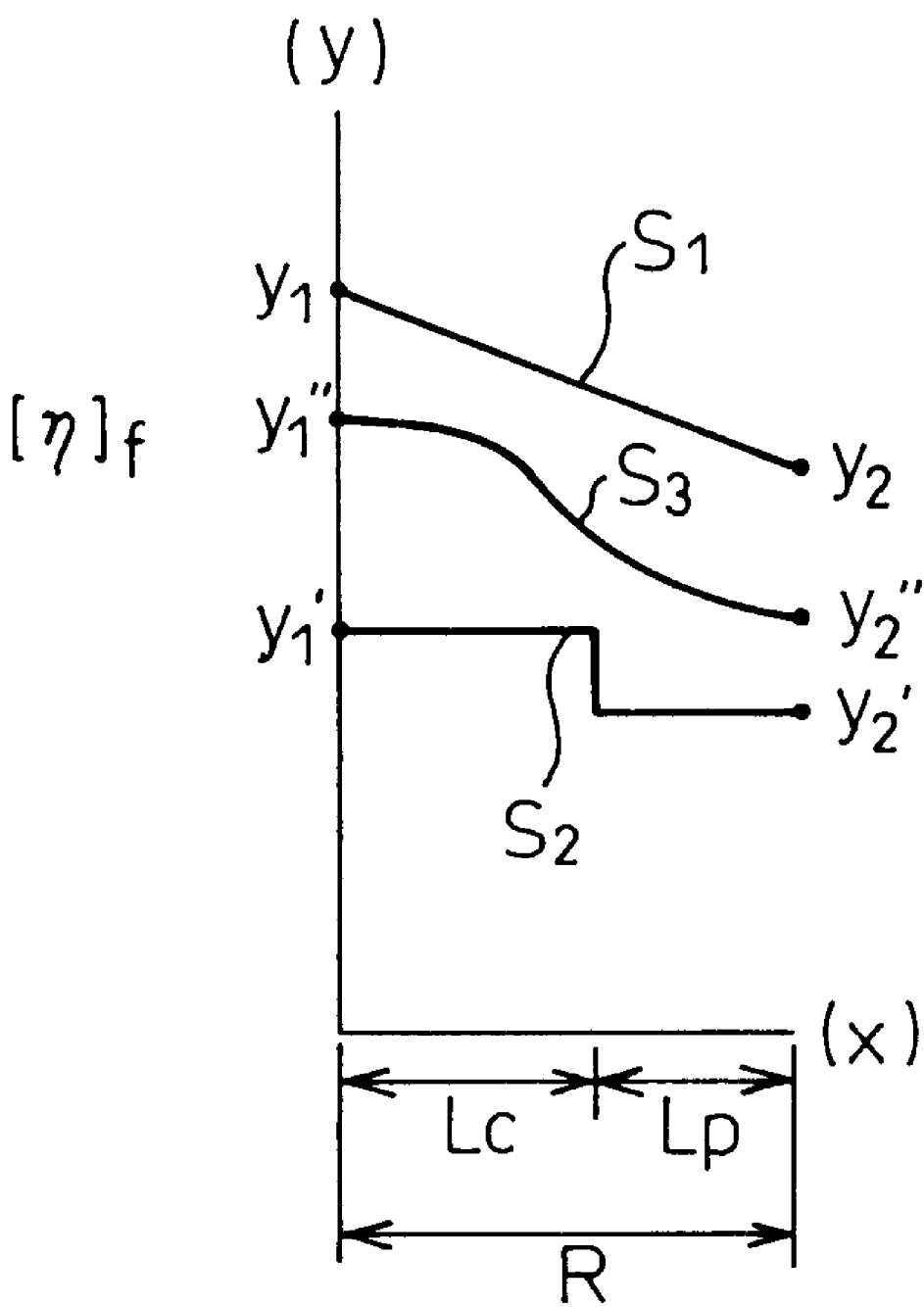
FIG. 2 is an explanatory diagram showing relationships S1, S2 and S3 between a distance (X) from a longitudinal axis of the monofilament shown in FIG. 1 and an intrinsic viscosity $[\eta]f$ of a polyester resin from which the monofilament is formed.

Referring to FIG. 2 which is an explanatory diagram showing relationships S1, S2 and S3 between the distance (X) from a longitudinal axis of the monofilament shown in FIG. 1 and an intrinsic viscosity (Y) of a polyester resin from which the monofilament is formed. In straight linear relationship S1, the intrinsic viscosity ($[\eta]f$) simply decreases along a straight line $Y_1$–$Y_2$ inclined downward from $Y_1$ to $Y_2$. In this case, the intrinsic viscosity of the polyester resin in the monofilament proportionally decreases with an increase in distance from the longitudinal axis of the monofilament determined at right angles to the longitudinal axis. In stepwise relationship S2, the intrinsic viscosity of the polyester resin in the monofilament decreases stepwise at the interface between the center part 1c and the peripheral part 1p of the monofilament. Namely, the intrinsic viscosity of a portion of the polyester resin located in the center part 1c of the monofilament is even at a level $Y'_1$ and is higher than the intrinsic viscosity of another portion of the polyester resin located in the peripheral part 1p of the monofilament which viscosity is even at a level $Y'_2$. In relationship S3, the intrinsic viscosities of the polyester resin in the center and peripheral parts of the polyester continuously decrease downward from $Y''_1$ to $Y''_2$ along a curve of secondary degree. In S3, the portion of the polyester resin having a highest intrinsic viscosity for the center part and the portion of the polyester resin having a lowest intrinsic viscosity for the peripheral part are diffuse-mixed at the interface part between the center and peripheral parts with each other. In the present invention, the intrinsic viscosities of the portions of polyester resin located in the center and peripheral parts of the monofilament are represented by average intrinsic viscosities $[\eta]f-c$ and $[\eta]f-p$, respectively.

Compared with the monofilament of the present invention, the conventional polyester monofilament of, for example, Japanese Unexamined Patent Publication No. 2-289,120 is constituted by a core part formed from a polyester homopolymer having an intrinsic viscosity of 0.80 and a sheath part formed from a polyethyleneglycol-copolymerized polyester copolymer having an intrinsic viscosity of 0.67 and exhibiting a low compatibility with the polyester homopolymer. In the conventional monofilament, the distribution of intrinsic viscosity of the polymers is in the manner shown in the relationship S2 of FIG. 2, wherein the intrinsic viscosity decreases stepwise at the interface between the core and sheath parts of the monofilament. The resultant polyester monofilament of the present invention has the peripheral part thereof having an improved surface property, namely a high resistance to abrasion and exhibit satisfactory mechanical strength and modulus.

For the purpose of improvement of the surface property of the polyester monofilament, it is important that the average intrinsic viscosity of the peripheral part of the monofilament is controlled to a range of from 0.6 to 11, preferably 0.6 to 1.0, particularly 0.6 to 0.8 when the monofilament is used for a plain guaze for a printing screen. When the above-mentioned feature is attained, the abrasion resistance of the resultant monofilament against metals, for example, metallic reeds, rollers and yarn guides, is significantly enhanced, and the mechanical strength of the resultant monofilament is substantially not affected by the above-mentioned feature.

In an embodiment of the polyester monofilament of the present invention, the center part (c) extending along a longitudinal axis of the monofilament has the highest average intrinsic viscosity and is concentrically surrounded by the peripheral part (p) of the monofilament.

In another embodiment of the polyester monofilament of the present invention, the center part (c) extending along a longitudinal axis of the monofilament has a highest average intrinsic viscosity and is concentrically surrounded by an intermediate part (i) and the peripheral part (p) of the monofilament concentrically surrounds the intermediate part (i) of the monofilament, the portion of the polyester resin located in the intermediate portion of the monofilament having an intrinsic viscosity lower than that of the center part (c) but higher than that of the peripheral part (p).

The portions of the polyester resin for the center, peripheral and optionally intermediate parts of the monofilament are preferably the same in the type of polymer as each other and are different in intrinsic viscosity from each other.

The polyester resin preferably comprises at least one member selected from the group consisting of polyethylene terephthalate, polybutylene terephthalate, polyethylene naphthalate, and polytrimethylene terephthalate.

In the present invention, it is essential that the monofilament is formed from a single type of a polyester resin, for example, polyethylene terephthalate, polybutylene terephthalate or polyethylene naphthalate, while the intrinsic viscosities of portions of the polyester resin for forming the center part, peripheral parts and optionally intermediate parts are varied from each other by imparting heat-histories different from each other to the portions of the polyester resin for forming the parts of the monofilament.

In the present invention, a non-crimping, core-in-sheath type polyester monofilament can be formed from at least two types of polyester resins different in intrinsic viscosity from each other by a conjugate melt-spinning process in which a melt of polyester resin having a higher intrinsic viscosity is extruded through a center part of a melt-spinning orifice and another melt of polyester resin having a lower intrinsic viscosity is extruded through a peripheral part of the orifice, while an intrinsic viscosity gradient decreasing from the core part toward the periphery of the monofilament is imparted to the polyester resin melt for the peripheral part of the monofilament. Of course, the same intrinsic viscosity gradient as mentioned above may be imparted to the higher intrinsic viscosity polyester resin melt for the core part of the monofilament. However, the intrinsic viscosity gradient of the center part of the monofilament is not so important in imparting a high mechanical strength and modulus to the monofilament.

Figure 3A:
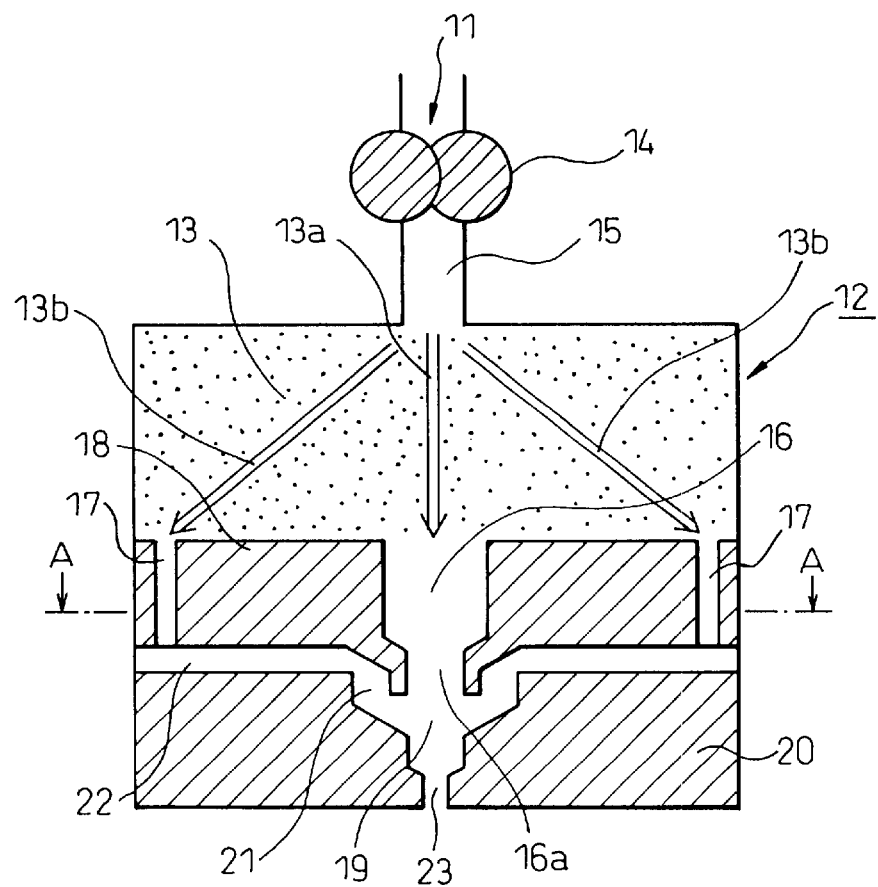
FIG. 3(a) is an explanatory vertical cross-sectional view of an embodiment of the melt-spinneret for producing the polyester monofilament of the present invention.

In the production of a polyester monofilament from two different polyester resins by using a melt spinneret similar to FIGS. 3(a) and (b), when a polyester resin melt stream introduced into a passage 5 and another polyester resin melt stream introduced into a passage 7 through passages 6 are separately controlled, the resultant monofilament has a core part having an even distribution of intrinsic viscosity and a sheath part having an intrinsic viscosity gradient decreasing in the direction from the core part toward the periphery of the monofilament.

The polyester resin for the polyester monofilament preferably has, as a whole, an average intrinsic viscosity $[\eta]f-a$ of 0.65 to 1.2, more preferably 0.7 to 1.1, determined as mentioned above.

Also, in the polyester monofilament of the present invention, a portion of the polyester resin located in the center part (c) of the monofilament preferably has an average intrinsic viscosity $[\eta]f-c$ of 0.7 to 1.3, more preferably 0.75 to 1.2, determined as mentioned above, but higher than the average intrinsic viscosity $[\eta]f-p$ of the portion of the polyester resin located in the peripheral part of the monofilament. The above-mentioned features contribute to enabling the resultant polyester monofilament to exhibit a satisfactory mechanical strength and mululus.

In the polyester monofilament of the present invention, preferably the average intrinsic viscosity $[\eta]f-c$ of the portion of the polyester resin located in the center part (c) of the monofilament is 0.02 to 0.20 more preferably 0.04 to 0.15, above the average intrinsic viscosity $[\eta]f-p$ of the portion of the polyester resin located in the peripheral part (p) of the monofilament.

In the cross-section of the polyester monofilament of the present invention, preferably, the area of the center part (c)

of the monofilament is in a proportion of 0.6 to 0.95, more preferably 0.80 to 0.95, to the whole cross-sectional area of the monofilament, and thus the area of the peripheral part (c) of the monofilament is in a proportion of 0.05 to 0.4, more preferably 0.05 to 0.2, to the whole cross-sectional area of the monofilament.

When the polyester monofilament of the present invention has a circular cross-sectional profile as shown in FIG. 1, preferably, the ratio (Lc/R) of the radium Lc of the circular center part C to the radius R of the cross-section is 0.77 to 0.98, more preferably 0.89 to 0.98, and thus the ratio (Lp/R) of the thickness Lp (=R−La) of the peripheral part p in the form of a ring concentrically surrounding the circular center part C to the radius R of the cross-section is 0.02 to 0.23, more preferably 0.02 to 0.11.

As mentioned above, the intrinsic viscosity of the polyester resin in the monofilament has a gradient distribution such that the intrinsic viscosity decreases in the direction of from the longitudinal axis toward the periphery of the monofilament. The average gradient ($\alpha$) of the polyester resin from which the monofilament is formed is preferably 1 to 30, more preferably 2 to 27. In FIG. 2, the average ingredient ($\alpha$) shown in S1 calculated by dividing the distance between $Y_1$ and $Y_2$ with a radius R of the cross-section, namely $\alpha=(\overline{Y_1-Y_2}/R)$. Also, in S3, the average gradient $\alpha=(\overline{Y''_1-Y''_2})/R$.

The polyester monofilament preferably has a high longitudinal uniformity in the thickness thereof. The longitudinal uniformity of the thickness is usually represented by an evenness (U %) in thickness. Preferably, the polyester filament of the present invention has a thickness evenness (U %) of 1.5% or less, more preferably 0.8% or less.

Also, the non-crimping property of filaments or fibers can be represented by a total percentage crimp (TC). The non-crimping polyester monofilament of the present invention preferably has a TC of 1.5% or less, more preferably 1.0% or less.

The polyester monofilament of the present invention is useful for various industries and preferably has a thickness of 1.1 to 55.6 dtex (1 to 55 denier), more preferably 3.3 to 33.3 dtex (3 to 30 denier). It should be noted that in the present invention, very thin polyester monofilaments having a thickness of 1.1 to 11.1 dtex (1 to 10 denier) can be practically produced and employed.

The polyester monofilament of the present invention can be produced by the process comprising the steps of:

melting a polyester resin having an intrinsic viscosity of 0.8 to 1.3, determined in o-chlorophenol at a temperature of 35° C.;

dividing the polyester resin melt into at least two portions;

passing the polyester resin melt portions through at least two passages which cause the intrinsic viscosity of the polyester resin melt portions to be decreased to extents different from each other;

extruding the polyester resin melt portions which are different from each other, in the intrinsic viscosities thereof, through a melt-spinning orifice, in such a manner that a polyester resin melt portion having a highest intrinsic viscosity is extruded through a center part of the orifice, and a polyester resin melt portion having a lowest intrinsic viscosity is extruded through a peripheral part concentrically surrounding the center part of the orifice, to form a filamentary stream of the polyester resin melt;

drafting and solidifying the resultant filamentary stream of the polyester resin melt to form a monofilament of the polyester resin;

taking up the drafted and solidified polyester monofilament; and heat-drawing the taken-up undrawn monofilament, During the extruding step through the heat-drawing step of the process of the present invention, the polyester resin portions different in intrinsic viscosity from each other are diffused in the interface portion thereof, into each other, to cause thereby, the resultant monofilament to have a distribution of the intrinsic viscosity of the polyester resin such that the farther the location of a part of the monofilament from the longitudinal axis of the monofilament in the direction at right angles to the longitudinal axis, the lower the intrinsic viscosity of a portion of the polyester resin located in the part of the monofilament, and a portion of the polyester resin located in the peripheral part of the monofilament has an average intrinsic viscosity [$\eta$]f–p of 0.6 to 1.1 determined in o-chlorophenol at a temperature of 35° C.

In the extruding step of the process of the present invention, optionally, a polyester resin melt portion having a medium intrinsic viscosity between the highest intrinsic viscosity and the lowest intrinsic viscosity is extruded through an intermediate part concentrically surrounding the center part and concentrically surrounded by the peripheral part of the orifice.

In the extruding step of the process of the present invention, the melt-spinning orifice may be a core-in-sheath type conjugate melt-spinning orifice. In this case, the core-in-sheath type conjugate melt-spinning orifice may have a sheet part composed of a peripheral part and at least one intermediate part which are arranged concentrically to the core part of the melt-spinning orifice, and between the core part and the peripheral part of the orifice.

In the process of the present invention, the taking up step for the drafted and solidified polyester monofilament is preferably carried out at a taking-up speed of 500 to 1500 m/min, more preferably 600 to 1300 m/min. Also, in the heat-drawing step, preferably the undrawn polyester monofilament is pre-heated to a temperature of 85 to 120° C., more preferably 90 to 110° C. and drawn at a draw ratio of 3 to 6, more preferably 3.5 to 5.5.

Figure 3B:
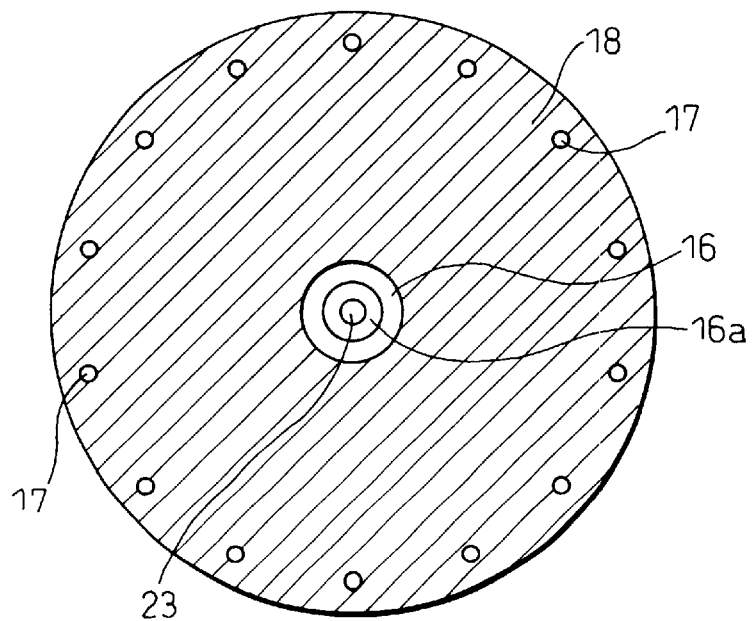
FIG. 3(b) is an explanatory horizontal cross-sectional view of the melt-spinneret of FIG. 3(a) along a horizontal line A—A.
Figure 4:
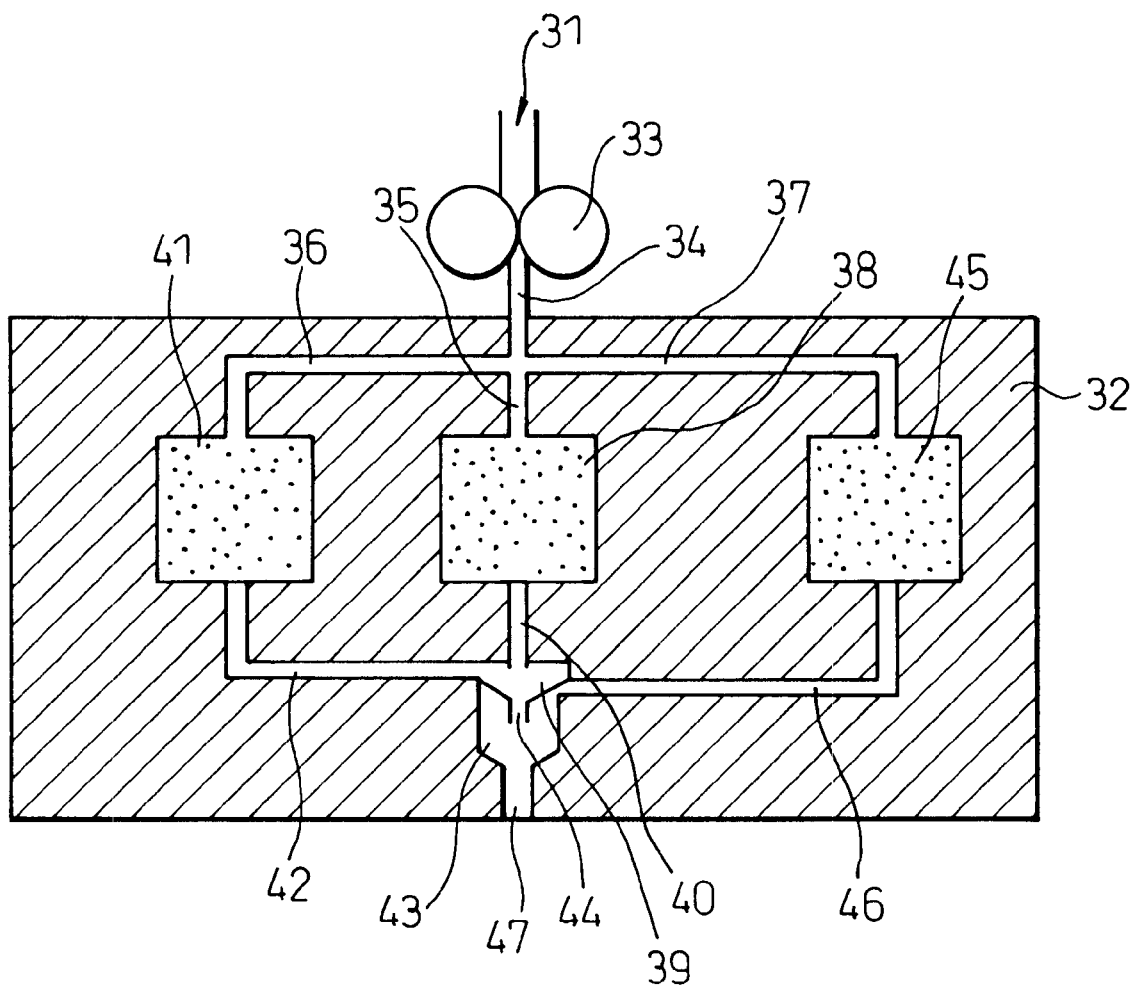
FIG. 4 is an explanatory vertical cross-sectional view of another embodiment of the melt-spinneret for producing the polyester monofilament of the present invention.

The process of the present invention will be further explained with referring to FIGS. 3(a), 3(b) and 4.

In FIG. 3(a) showing an explanatory vertical cross-sectional view of an embodiment of the melt-spinneret usable for the process of the present invention, and FIG. 3(b) showing an explanatory horizontal cross-sectional view of the melt-spinneret of FIG. 3(b), along a horizontal line A—A shown in FIG. 3(b), a melt 11 of a polyester resin is introduced into a filtering layer 13 of a melt spinneret 12 through a metering pump 14 and a conduit 15.

The filtered melt of the polyester resin is distributed into a center hole 16 and a plurality of peripheral holes 17 formed in a distribution disc 18. Namely, a portion of the polyester resin melt is passed through a shorter path 13a of the filtration layer 13 and is introduced into the center hole 16 of the distribution disc 18 and another portions of the polyester resin melt is passed through longer paths 13b of the filtration layer 13 and are introduced into a plurality of peripheral holes 17. While the melt of the polyester resin passes through the filtering layer 13, the intrinsic viscosity of the polyester resin melt decreases with the staying time of the polyester resin melt portion in the filtering layer 13 and/or with the distance of the path 13a or 13b through which a portion of the polyester resin melt through in the filtering layer 13. The portion of the polyester resin melt introduced into the center hole 16 flows downward and is introduced into a center part of a funnel-shaped chamber 19 formed in an extrusion disc 20 through an outlet 16a of the center hole 16 extending downward into the funnel shaped chamber 19. Also, the portions of the polyester resin melt introduced into the peripheral holes 17 are introduced into a peripheral part 21 of the funnel shaped chamber 19 through a path 22 formed between the distribution disc 18 and the extrusion disc 20, and thus a composite stream consisting of a center stream formed from polyester resin melt portion having a higher intrinsic viscosity and a peripheral stream formed from the polyester resin melt portions having a lower intrinsic viscosity and concentrically surrounding the center flow is formed. The composite stream flows downward through the funnel shaped chamber 19 while being made thinner, and then is extruded through a melt-spinning orifice 23 to form an undrawn polyester monofilament. In the melting step, the dividing step and the extruding step, the polyester resin melt is kept at a temperature in the range of from 290 to 310° C.

The path length and the staying time of the portions of the polyester resin melt, from which the peripheral part of the monofilament is formed, in the spinneret 12 are longer than those of the portion of the polyester resin melt, from which the center part of the monofilament is formed. Thus, the intrinsic viscosity of the portion of the polyester resin located in the peripheral part of the polyester monofilament is lower than that of the portion of the polyester resin located in the center part of the monofilament, while these portions of the polyester resin are formed from a single type of polyester resin. Therefore, the higher and lower intrinsic viscosity portions of the polyester resin are compatible with each other and diffuse into each other at the interface portions between the center and peripheral parts of the monofilament. Thus, a clear interface between the center and peripheral parts are not maintained, and the intrinsic viscosity of the polyester resin continuously changes between the center and peripheral parts of the monofilament.

For the purpose of finely controlling the difference in the intrinsic viscosity between the polyester resin portions located in the center and peripheral parts of the monofilament, intermediate holes for portions of the polyester resin melt may be provided between the center hole 16 and the peripheral holes 17 so as to allow the polyester resin melt portions passed through the intermediate holes and having a moderate intrinsic viscosity to be introduced into intermediate part between the center part and the peripheral part of the funnel-shaped chamber 19.

FIG. 3 shows an explanatory cross-sectional view of a melt-spinneret for producing a polyester monofilament of the present invention having a center part formed from a portion of a polyester resin having a highest intrinsic viscosity, an intermediate part formed from a portion of the polyester resin having a lower intrinsic viscosity than that of the center part and concentrically surrounding a center part, and a peripheral part formed from a portion of the polyester resin having a lowest intrinsic viscosity and concentrically surrounding the intermediate part of the monofilament.

In FIG. 3, a melt 31 of a polyester resin is fed into a melt spinneret 32 through a metering pump 33 and a conduit 34. The polyester resin melt 31 is distributed into three conduits 35, 36 and 37. The portion of the polyester resin melt passed through the shorted conduit 35 is introduced into a filtering layer 38, the filtered portion of the polyester resin melt is introduced into a center part of a first melt chamber 39 through a conduit 40. The portion of the polyester resin melt passed through the conduit 30 which is larger than the conduit 35, is introduced into a filtering layer 41, and the filtered portion of the polyester resin melt is introduced into a peripheral part of the first melt chamber 39 through a conduit 42, which is longer than the conduit 40, to provide a first composite stream of the polyester resin in which a center stream consisting of the portion of the polyester resin melt passed through the filtering layer 37 is concentrically surrounded by a peripheral stream consisting of the portion of the polyester resin melt passed through the filtering layer 41. The first composite stream of the polyester rein melt is introduced into a center part of a second melt chamber 43 through an orifice 44 formed in a center part of the bottom of the first melt chamber 39 and extending downward into the second melt chamber 43.

Separately, a portion of the polyester resin melt passed through the conduit 37 which is longer than the conduit 36 was introduced into a filtering layer 45, and the filtered portion of the polyester resin melt is introduced into a peripheral part of the second melt chamber 43 surrounding the center orifice of the bottom of the first melt chamber 39, through a conduit 46 longer than the conduit 42. In the second melt chamber 43, the first composite stream consisting of the center stream of the portion of the polyester resin melt passed through the filtering layer 38 and a peripheral stream of the portion of the polyester resin melt passed through the filtering layer 41, is concentrically surrounded by a peripheral stream of the portion of the polyester resin melt passed through the filtering layer 45, to form a second composite stream. In this second composite stream, the peripheral stream of the first composite stream is present as an intermediate stream concentrically surrounding the center stream of the first composite stream and concentrically surrounded by the peripheral stream of the second composite stream.

In the spinneret 32, the portion of the polyester resin melt for the center stream passes through a shortest path comprising the conduit 35, the filtering layer 38 the conduit 40 and the first melt chamber and has a highest intrinsic viscosity; the portion of the polyester resin melt for the peripheral stream passes through a longest path comprising the conduit 37, the filtering layer 45 and the conduit 46 and has a lowest intrinsic viscosity, and the portion of the polyester resin melt for the intermediate stream passes through a middle length path comprising the conduit 36, the filtering layer 41, the conduit 42 and the first melt chamber 39, and has a moderate intrinsic viscosity.

The second composite stream flows downward through the second melt chamber while the diameter of the second composite stream is continuously decreased and then extruded through a melt-spinning orifice 47.

The extruded monofilamentary stream is solidified while being drafted under tension. The resultant undrawn monofilament is taken up and heat-drawn. The heat-drawing conditions are established in response to the draft-solidifying conditions and the taking-up speed. For example, when the undrawn monofilament is taken-up at a speed of 800 to 1500 m/min, it is preferably pre-heated on feed rollers at a temperature of 85 to 120° C. for a preheating time of 0.5 to 1 second, and drawn at a draw ratio of 3 to 6. Optionally, the drawn polyester monofilament is heat treated at a temperature of 150 to 240° C. for 0.1 to 0.5 second.

Optionally, a plurality of undrawn polyester monofilaments are bundled and the monofilament bundle (or a multifilament yarn) is drawn and optionally heat-treated. Then the resultant individual monofilaments are separated from each other, if necessary. As mentioned above, since the portions of the polyester resin different in intrinsic viscosity thereof from each other are compatible with each other, the portions of the polyester resin located in the core, peripheral and optionally intermediate parts of the monofilament are easily diffused into each other at the interface portions therebetween. Thus the interfaces between the parts of the monofilament are unclear.

The non-crimping polyester monofilament of the present invention can be employed in the form of an individual monofilament, or of a doubled filament yarn or of staple fibers, in various uses. Preferably, the polyester monofilament of the present invention is employed in a use in which the monofilament is required to have a high resistance to abrasion with metal materials. Also, the polyester monofilament of the present invention exhibits a high adhesive property to rubber, an excellent fatigue resistance, an enhanced dyeability of the peripheral surface of the monofilament, and an enhanced knot strength, and thus is useful as a material yarn for ropes, nets, guts, tarpaulins, tents, paragliders and sailcloths.

EXAMPLES

The present invention will be further illustrated by the following examples.

In the examples, intrinsic viscosity of polyester resin, and tensile strength, ultimate elongation, yarn evenness (U %), total percentage crimp (TC) of monofilament, evaluation of scum generation, modulus of screen, and general evaluation of the monofilament were determined in the following measurements.

(1) Intrinsic Viscosity of Polyester Resin

A polyester resin was dissolved in orthochlorophenol at a temperature of 35° C. in various concentration (C) to provide a plurality of diluted solutions. The viscosities ($\eta r$) of the solutions were measured. The intrinsic viscosity [$\eta$] of the polyester resin was determined in accordance with the following equation.

$$[\eta] = \text{limit} \, (ln \, \eta r/C)$$

(2) Tensile Strength and Ultimate Elongation

The tensile strength and ultimate elongation of a polyester monofilament was determined in accordance with Japanese Industrial Standard (JIS) L-1013, in which a specimen having a length of 25 cm was stretched at a elongation speed of 30 cm/min until the specimen is broken. The tensile strength and ultimate elongation are a stress at bleak and an elongation at break of the specimen.

(3) 5% Modulus

In the measurement of the tensile strength and ultimate elongation, as mentioned above (2), a stress of the specimen generated at an elongation of 5% was measured.

(4) Yarn Evenness (U %)

A specimen of a monofilament was subjected to a yarn evenness measurement using an USTER 3 made of ZELL-WEGER CO., at a yarn specimen length of 300 m at a measurement rate of 100 m/minute for 3 minutes. In the measurement, a graph showing a relationship between the length and the weight per length units of the specimen having a longitudinal length L was provided; an average weight per length units of the specimen was determined from the graph; and a straight line showing the average weight per length units of the specimen was drawn in the graph.

The U % of the specimen was calculated in accordance with the equation:

$$U(\%) = \frac{f}{F} \times 100$$

wherein F represents a total weight of the specimen having the longitudinal length L, and f represents an integration value of deviations in weight from the average weight per length units of the specimen, determined from the graph.

(5) Total Percentage Crimp (TC)

A specimen of a monofilament was reeled into a hank having a total thickness of about 1667 dtex (about 1500 denier), a load of 19.6 N×10$^{-6}$ of (2 mg) was applied to a bottom center point of the hank. The loaded hank was treated in boiling water for 20 minutes and the naturally dried at 20° C. at 65% RH for one day and night, to allow the hank to crimp. The crimped monofilament hank was loaded with a load of 19.6 N×10$^{-4}$ of (200 mg) per 0.9 dtex (1 denier) for one minute and then the length ($l_0$) of the hank was measured, the load was changed from 19.6 N×10$^{-4}$ (200 mg) to 19.6 N×10$^{-6}$ (2 mg) per 0.9 dtex (1 denier), was maintained for one minute and then the length ($l_1$) of the hank was measured. The total percentage crimp (TC) was calculated in accordance with the following equation.

$$TC(\%) = \{(l_0 - l_1)/l_0\} \times 100$$

(6) Evaluation of Scum Generation

Polyester monofilaments were subjected to a weaving procedure for producing a mesh weave by using a projectile type loom at a rotation rate of 250 rpm. During the weaving procedure, the staining of the reeds is observed, and when the reed is stained to such an extent that the weaving procedure cannot be continued, the weaving procedure is interrupted to clear the reed. The length of the resultant mesh fabric obtained between the start and the interruption of the weaving procedure is referred to a reed-cleaning period (m). The longer the reed-cleaning period, the smaller the amount of scum generated on the reed.

(7) Modulus of Monofilament Screen Weave

A specimen of monofilament screen weave (plain guaze) having a width of 5 cm was subjected to a tensile test at a length of the specimen between gripping members at a tensile rate of 10 cm/min, using a constant rate stretch type tensile tester in accordance with JIS L1096, to prepare a stress-strain curve of the screen weave. When the elongation of the specimen reaches 10%, the tensile stress (N (kgf)) is measured. The modulus of the screen weave is represented by the tensile stress at an elongation of 10%.

(8) General Evaluation

From the evaluation result of scum generation and the screen weave modulus, the monofilament is evaluated in the following three classes.

| Class | Reed-cleaning period (m) | Screen weave modulus (N) |
| --- | --- | --- |
| 3 | 250 m or more | 140.1N (15 kgf) or more |
| 2 | 100 m or more but less than 250 m | 98.1N (10 kgf) or more but less than 140.1N (15 kgf) |
| 1 | Less than 100 m | Less than 98.1N (10 kgf) |

Reference Example 1

A polyester (polyethylene terephthalate) resin was subjected to heat treatments in a nitrogen gas atmosphere (no oxygen atmosphere) at the temperature of 280 to 300° C. for the times of 5 to 15 minutes shown in Table 1, and each heated specimen was subjected to a intrinsic viscosity measurement. The resultant reduction in intrinsic viscosity in each heat treatment is shown in Table 1.

TABLE 1

| Heating time | Heating temperature | | |
|---|---|---|---|
| | 280° C. | 290° C. | 300° C. |
| 5 minutes | 0.016 | 0.031 | 0.049 |
| 10 minutes | 0.031 | 0.050 | 0.087 |
| 15 minutes | 0.046 | 0.065 | 0.112 |

Table 1 shows that the higher the heating temperature and the longer the heating time, the longer the reduction in the intrinsic viscosity of the polyester resin. Namely, the intrinsic viscosity reduction by the heating treatment at a temperature of 300° C. for 10 minutes is larger by 0.071 than that by the heating treatment at a temperature of 280° C. for 5 minutes.

When the heat-treated polyester resin at 300° C. for 10 minutes is melt-spun at an extruding rate of 4.27 g/minute at a taking up speed of 1200 m/minute and the resultant undrawn filament is drawn at a draw ratio of 3.8, the resultant drawn filaments had an ultimate elongation of about 12% higher than that of the drawn polyester filaments produced from the heat-treated polyester resin at a temperature of 280° C. for 5 minutes through the same procedures as mentioned above.

To obtain a large difference in the intrinsic viscosity of the polyester resin generated due to difference in heat history during the undrawn monofilament-forming procedures, the starting polyester resin preferably has a relatively high average intrinsic viscosity ($[\eta]f-a$), for example, of 0.65 or more, more preferably 0.70 or more, but usually not more than about 1.3.

To generate the difference in the intrinsic viscosity of the polyester resin, a plurality of melt-extruders having extruding temperatures different from each other may be employed. In this case, the center, peripheral, and optionally intermediate parts of the monofilament are formed from a plurality of polyester resin melts different in temperature from each other and supplied from the plurality of extruders. This monofilament-producing process is similar to that for producing composite monofilament from a plurality of polymers different in type thereof, and is disadvantageous in that the employment of the plurality of extruders causes the production cost of the monofilament to be very high and the production of very thin monofilament to become difficult.

In another process, a plurality of monofilaments can be produced by a melt-spinning procedure using only one metering pump, and are then separated from each other. In this method, the proportion of the sheath part of the monofilament can be easily made small. However, in this process including the monofilament-separating procedure, it is difficult to severely uniformalize the thickness of the separated monofilaments.

Reference Example 2

A polyethylene trephthalate resin having an intrinsic viscosity [$\eta$] of 0.90 was melted in a melt-extruder and the melting temperature of the resin was controlled to 290° C. The melt is passed through a heating box heated with a heating medium to a temperature of 300° C. and then extruded through a metering gear pump with 0.3 ml/rev. The measured temperature of the extruded melt through the metering pump was 300° C. In the above-mentioned melting and gear pump extruding procedures for the melt, the gear pump extruding rate was varied as shown in Table 2, and the extruded melt samples were subjected to the intrinsic viscosity measurement. The measurement results are shown in Table 2.

TABLE 2

| Run No. | Gear pump extrusion rate 1 g/minute | Intrinsic viscosity of extruded melt samples |
|---|---|---|
| 1 | 5.0 | 0.78 |
| 2 | 7.5 | 0.80 |
| 3 | 10.0 | 0.82 |
| 4 | 12.5 | 0.83 |

Table 2 shows that the higher the gear pump extrusion rate, and thus the shorter the staying time of the melt in the gear pump, the higher the intrinsic viscosity of the extruded melt, and thus the smaller a reduction in the intrinsic viscosity of the extruded melt. The absolute value of the intrinsic viscosity reduction is variable in response to the volume of path for the melt in the melt-spinning apparatus and temperature profile of the melt. When a single and the same apparatus is employed, the reduction in the intrinsic viscosity of the polyester resin melt is effected in response to the heating temperature and the heating time applied to the melt.

Separately, the same heating and extruding procedures as mentioned above were carried out except that the gear pump extrusion rate was fixed to 7.5 g/minute, the melt was passed through a filtering layer having the filtering volume (internal volume) as shown in Table 3, and after staying in the extruder apparatus for the average time as shown in Table 3, the filtered melt was extruded. The extruded melt was subjected to the intrinsic viscosity measurement. The measurement results are shown in Table 3.

TABLE 3

| Run No. | Volume of filtering layer (ml) | Staying time of melt (minute) | Intrinsic viscosity of extruded melt ($[\eta]f$) |
|---|---|---|---|
| 1 | 12 | 2 | 0.780 |
| 2 | 24 | 4 | 0.761 |
| 3 | 60 | 10 | 0.711 |

Table 3 shows that the intrinsic viscosity of the polyester resin melt decreases with an increase in the staying time of the melt.

EXAMPLE 1

A polyethylene terephthalate resin having an intrinsic viscosity of 0.8 was melted at a temperature of 300° C. and fed into a melt spinneret as shown in FIGS. 3($a$) and 3($b$) through a metering gear pump 14 at a feed rate of 5 ml/minute. In the melt spinneret 12 of FIGS. 3($a$) and 3($b$) had a total inner volume of 12 ml, the distribution disc 18 had a center path 16 having a diameter of 5 mm, and 24 peripheral paths 17 arranged on a circle concentric to the center path 16. The peripheral paths had the diameter as shown in Table 4. The composite stream formed in the melt chamber 19 was extruded through the melt-spinning orifice 23 at an extrusion rate of 5 ml/minute. The extruded monofilamentary stream passed through a heating atmosphere zone having a temperature of 350° C. and a length of 100 mm, then cool-solidified under drafting and taken up at a speed of 1000 m/minute. The resultant undrawn monofilament was brought into contact with drawing hot rolls heated respectively at a temperature of 100° C. and 140° C. and drawn at a draw ratio of 4.0 between the drawing rolls. A polyester monofilament having a thickness of 10 dtex (9 denier) was obtained.

The drawn monofilament was subjected to a measurement of average intrinsic viscosity thereof and thereafter to a mild alkali weight reduction treatment in an aqueous sodium hydroxide (NaOH) solution having a two mole (2 M) concentration and containing 3 g/liter of an quaternary ammonium salt type alkali weight reduction promotor, in a liquor ratio (a ratio in weight of the treating bath to the monofilament) of 200 or more at a temperature of 30° C. When the thickness of the monofilament reached to 8.9 dtex (8 denier), the monofilament was washed with water, dried in the ambient air atmosphere and subjected to an average intrinsic viscosity measurement. These procedures were repleated when the thickness of the monofilament was reduced to 7.8 dtex (7 denier), to 6.7 dtex (6 denier), and 5.6 dtex (5 denier). From the resultant data, average intrinsic viscosities of the center part having a thickness of 5.6 dtex (5 denier), a first annular part having an inner thickness of 5.6 dtex (5 denier) and an outer thickness of 6.7 dtex (6 denier) and surrounding the center part, a second annular part surrounding the first annular part and having an inner thickness of 6.7 dtex (6 denier) and an outer thickness of 7.8 dtex (7 denier), a third annular part surrounding the second annular part and having an inner thickness of 7.8 dtex (7 denier) and an outer thickness of 8.9 dtex (8 denier), and an outermost is annular part surrounding the third annular part and having an inner thickness of 8.9 dtex (8 denier) and an outer thickness of 10 dtex (9 denier), were calculated. The results are shown in Table 4. In the calculation, when a polymer having an intrinsic viscosity of 0.8 was mixed with another polymer having an intrinsic viscosity of 0.75 in a weight ratio of 1:1, the mixed polymer has an average intrinsic viscosity of $\{(0.8\times1)+(0.75\times1)\}/(1+1)=0.775$.

Comparative Example 1

A polyester monofilament was prepared and tested by the same procedures as in Example 1, except that the filtration of the polyester resin melt was carried out so that no difference in intrinsic viscosity was generated between the portion of the melt for forming the center portion and the portions of the melt for forming the peripheral portion of the monofilament. For this purpose, in the melt spinneret as shown in FIGS. 3(a) and 3(b), all the peripheral holes 17 are closed and five static mixers were arranged in series in the center hole 16, so that the polyester resin melt can uniformly pass through the filtering layer 13 without generating a difference in staying time between portions of the polyester resin melt.

The test results are shown in Table 4.

TABLE 4

| | | Item | | | | |
|---|---|---|---|---|---|---|
| | | Average intrinsic viscosity [η] f-a | | | | |
| | | Center part | Peripheral part | | | |
| Example No. | Diameter of peripheral hole 17 (mm) | with thickness of 5.6 dtex | Thickness 5.6 to 6.7 dtex | Thickness 6.7 to 7.8 dtex | Thickness 7.8 to 8.9 dtex | Thickness 8.9 to 10 dtex |
| Example 1 | | | | | | |
| Run 1 | 3 | 0.754 | 0.751 | 0.747 | 0.743 | 0.738 |
| Run 2 | 1.5 | 0.762 | 0.754 | 0.745 | 0.732 | 0.724 |
| Run 3 | 1.0 | 0.765 | 0.759 | 0.740 | 0.705 | 0.689 |
| Comparative Example 1 | — | 0.744 | 0.743 | 0.746 | 0.744 | 0.745 |

Table 4 clearly shows that when the flow rate of the portion of the polyester melt through the peripheral holes 17 is restricted (made low), the reduction in intrinsic viscosity of the portion of the polyester resin melt could be larger than that of the portion of the polyester resin melt passed through the center hole 16.

In the comparative Example 1, substantially no difference in intrinsic viscosity of the polyester resin was generated between the center part and the peripheral part of the monofilament.

EXAMPLE 2 and 3 and

Comparative Examples 2 and 3

In each of Examples 2 and 3 and Comparative Examples 2 and 3, a polyester monofilament having a thickness of 10 dtex (9 denier) was prepared and tested by the same procedure as in Example 1, Run 2, except that the extrusion rate was 5 g/minute and the taking up speed and draw ratio were controlled to provide a monofilament having the tensile strength and the ultimate elongation as shown in Table 5. In the comparative Examples 2 and 3, a usual simple melt spinneret for monofilament was employed.

The monofilament was converted to a 350 mesh screen weave by using a projectile type loom under a warp tension of 98.0655 mN (10 gf) per monofilament at a reed clearance of 35 µm and finished.

The physical properties and weaving property of the monofilament and the evaluation results of the screen weave are shown in Table 5.

TABLE 5

| | | Monofilament | | | Screen weave | | |
|---|---|---|---|---|---|---|---|
| Example No. | Type of spinneret | Tensile strength (N/1.1 dtex) | Ultimate elongation (%) | Tensile stress at 5% elongation (N) | Scum generation (m) | Modulus (N) | General evaluation |
| Example | | | | | | | |
| 2 | FIGS. 3(a) | 6.7 | 41 | 26.5 | 600 | 98.1 | 2–1 |
| 3 | and 3(b) | 7.2 | 31 | 38.2 | 280 | 186.3 | 3 |
| Comparative Example | | | | | | | |
| 2 | Simple | 6.7 | 40 | 26.5 | 240 | 88.3 | 2–1 |
| 3 | spinneret | 7.2 | 30 | 39.2 | 50 | 176.5 | 1 |

Table 5 shows that when the polyester monofilaments of the present invention are useful for producing screen weave having a high modulus for screen printing and exhibit a high resistance to scum generation during the weaving procedure.
Industrial Applicability In the polyester monofilament of the present invention has a center part formed from a portion of a polyester resin having a high intrinsic viscosity, and a peripheral part formed from another portion of the polyester resin having a low intrinsic viscosity. In the intrinsic viscosity distribution of the monofilament, the intrinsic viscosity decreases with increase in the distance from the longitudinal axis of the monofilament. The polyester monofilament of the present invention can be produced by the process of the present invention wherein, in a melt spinneret, a portion of the polyester resin melt supplied into the spinneret is caused to have a higher reduction in the intrinsic viscosity than that of another portion of the polyester resin melt, and a peripheral part of the monofilament is formed from the portion of the polyester resin melt having a lowest intrinsic viscosity and a center part of the monofilament is formed from another portion of the polyester resin melt.

The difference in reduction of the intrinsic viscosity can be controlled by controlling the heat history (staying time and heating temperature) of each portion of the polyester melt in the spinneret.

When the polyester monofilament of the present invention is employed to produce a screen weave (plain gauze), the polyester monofilament of the present invention having, as a whole, a high tensile strength, a high modulus and a low ultimate elongation enables the generation of scum during the weaving procedure to prevent or restrict. Also, the polyester monofilament of the present invention can have a smaller thickness than that of conventional polyester monofilaments. Thus, the polyester monofilament of the present invention enables various mesh woven fabrics having a high modulus, high warp and weft densities, a high ratio of total opening area to the total area of the fabric, and a high mechanical strength to be practically produced. Also, when the mesh woven fabrics are employed for screen printing, the accuracy of the printing is high, the resistance to fatigue of the fabric due to a squeezing action applied to the fabric during printing procedure is high, and an elongation of the fabric during the printing procedure is low.

Thus, the polyester monofilament and the polyester monofilament-producing process of the present invention can be advantageously employed in practice.

What is claimed is:

1. A non-crimping polyester monofilament formed from a polyester resin, wherein the polyester resin has an intrinsic viscosity which varies in such manner that the farther the location of a part of the monofilament from the longitudinal axis of the monofilament in the direction at right angles to the longitudinal axis, the lower the intrinsic viscosity of a portion of the polyester resin located in the part of the monofilament, and a portion of the polyester resin located in a peripheral part (p) of the monofilament has an average intrinsic viscosity $[\eta]$f–p of 0.6 to 1.1, determined in orthochlorophenol at a temperature of 35° C., the peripheral part (p) concentrically surrounding a center part (c) of the monofilament extending along the longitudinal axis of the monofilament.

2. The polyester monofilament as claimed in claim 1, wherein the center part (c) extending along a longitudinal axis of the monofilament has a high average intrinsic viscosity and is concentrically surrounded by the peripheral part (p) of the monofilament.

3. The polyester monofilament as claimed in claim 1, wherein the center part (c) extending along a longitudinal axis of the monofilament has a high average intrinsic viscosity and is concentrically surrounded by an intermediate part (i) and the peripheral part (p) of the monofilament concentrically surrounds the intermediate part (i) of the monofilament, the portion of the polyester resin located in the intermediate portion of the monofilament having an intrinsic viscosity lower than that of the center part (c) but higher than that of the peripheral part (p).

4. The polyester monofilament as claimed in claim 1, wherein the polyester resin comprises a single chemical type of a polyester polymer.

5. The polyester monofilament as claimed in claim 1, wherein the polyester resin comprises at least one member selected from the group consisting of polyethylene terephthalate, polybutylene terephthalate, polyethylene naphthalate, and polytrimethylene terephthalate.

6. The polyester monofilament as claimed in claim 1, wherein the polyester resin for the polyester monofilament has an average intrinsic viscosity $[\eta]$f–a of 0.7 to 1.2, determined as mentioned above.

7. The polyester monofilament as claimed in claim 1, wherein a portion of the polyester resin located in the center part (c) of the monofilament has an average intrinsic viscosity $[\eta]$f–c of 0.7 to 1.3, determined as mentioned above, which is higher than the average intrinsic viscosity $[\eta]$f–p of the portion of the polyester resin located in the peripheral part of the monofilament.

8. The polyester monofilament as claimed in claim 1, wherein the average intrinsic viscosity $[\eta]$f–p of the portion of the polyester resin located in the peripheral part of the monofilament is in the range of from 0.6 to 1.0, determined as mentioned above.

9. The polyester monofilament as claimed in claim 1, wherein the average intrinsic viscosity $[\eta]f$-c of the portion of the polyester resin located in the center part (c) of the monofilament is 0.02 to 0.20 above the average intrinsic viscosity $[\eta]f$-p of the portion of the polyester resin located in the peripheral part (p) of the monofilament.

10. The polyester monofilament as claimed in claim 1, wherein in the cross-section of the monofilament, the area of the center part (c) of the monofilament is in a proportion of 0.6 to 0.95 to the whole cross-sectional area of the monofilament.

11. The polyester monofilament as claimed in claim 1, wherein in the cross-section of the monofilament, the area of the peripheral part (p) of the monofilament is in a proportion of 0.05 to 0.4 to the whole cross-sectional area of the monofilament.

12. The polyester monofilament as claimed in claim 1, wherein the cross-sectional profile of the monofilament is in the form of a circle.

13. The polyester monofilament as claimed in claim 12, wherein in the circular cross-section of the monofilament, a ratio Lc/R of the thickness Lc of the center part (c) of the monofilament to the radius R of the monofilament is in the range of from 0.77 to 0.98.

14. The polyester monofilament as claimed in claim 12, wherein in the circular cross-section of the monofilament, a ratio Lp/R of the thickness Lp of the peripheral part (p) of the monofilament to the radius R of the monofilament is in the range of from 0.02 to 0.23.

15. The polyester monofilament as claimed in claim 1, wherein the polyester resin from which the monofilament is constituted has an average gradient ($\alpha$) of intrinsic viscosity thereof in a range of from 1 to 30.

16. The polyester monofilament as claimed in claim 1, having an average tensile strength of 52.96 to 88.26 mN/dtex (6.0 g/d to 10.0 g/d).

17. The polyester monofilament as claimed in claim 1, exhibiting a stress of 26.48 mN/dtex(3.0 g/d) or more under an elongation of 5% thereof.

18. The polyester monofilament as claimed in claim 1, having an average ultimate elongation in a range of from 10 to 30%.

19. The polyester monofilament as claimed in claim 1, having an evenness(U%) in thickness thereof of 1.5% or less.

20. The polyester monofilament as claimed in claim 1, having a thickness of 2.2 to 55.6 dtex (2 to 50 denier).

21. A process for producing a non-crimping polyester monofilament, comprising:

melting a polyester resin having an intrinsic viscosity of 0.8 to 1.3, determined in o-chlorophenol at a temperature of 35° C.;

dividing the polyester resin melt into at least two portions;

passing the polyester resin melt portions through at least two passages which cause the intrinsic viscosity of the polyester resin melt portions to be decreased to extents different from each other;

extruding the polyester resin melt portions, which are different from each other in the intrinsic viscosities thereof, through a melt-spinning orifice in such a manner that a polyester resin melt portion having a highest intrinsic viscosity is extruded through a center part of the orifice, and a polyester resin melt portion having a lowest intrinsic viscosity is extruded through a peripheral part concentrically surrounding the center part of the orifice, to form a filamentary stream of the polyester resin melt;

drafting and solidifying the resultant filamentary stream of the polyester resin melt to form a monofilament of the polyester resin;

taking up the drafted and solidified polyester monofilament; and heat-drawing the taken-up undrawn monofilament, wherein during the extruding step through the heat-drawing step, the polyester resin portions different in intrinsic viscosity from each other are diffused, in the interface portion thereof, into each other, to cause the resultant monofilament to have a distribution of the intrinsic viscosity of the polyester resin such that the farther the location of a part of the monofilament from the longitudinal axis of the monofilament in the direction at right angles to the longitudinal axis, the lower the intrinsic viscosity of a portion of the polyester resin located in the part of the monofilament, and a portion of the polyester resin located in the peripheral part of the monofilament has an average intrinsic viscosity $[\eta]f$-p of 0.6 to 1.1 determined in o-chlorophenol at a temperature of 35° C.

22. The process for producing a non-crimping polyester monofilament as claimed in claim 21, wherein in the extruding step, a polyester resin melt portion having a medium intrinsic viscosity between the highest intrinsic viscosity and the lowest intrinsic viscosity is extruded through an intermediate part concentrically surrounding the center part and concentrically surrounded by the peripheral part of the orifice.

23. The process for producing a non-crimping polyester monofilament as claimed in claim 21, wherein the melt-spinning orifice is a core-in-sheath type conjugate melt-spinning orifice.

24. The process for producing a non-crimping polyester monofilament as claimed in claim 23, wherein the melt-spinning orifice is a core-in-sheath type conjugate melt-spinning orifice in which the sheath part is composed of a peripheral part and at least one intermediate part which are arranged concentrically to the core part of the melt-spinning orifice.

25. The process for producing a non-crimping polyester monofilament as claimed in claim 21, wherein the polyester resin comprises a single chemical type of polyester polymer.

26. The process for producing a non-crimping polyester monofilament as claimed in claim 21, wherein the polyester resin comprises at least one member selected from the group consisting of polyethylene terephthalate, polybutylene terephthalate, polyethylene naphthalate and polytrimethylene terephthalate.

27. The process for producing a non-crimping polyester monofilament as claimed in claim 21, wherein the taking up step for the drafted and solidified polyester monofilament is carried out at a taking-up speed of 500 to 1500 m/min.

28. The process for producing a non-crimping polyester monofilament as claimed in claim 21, wherein in the heat-drawing step, the undrawn polyester monofilament is preheated to a temperature of 85 to 120° C. and drawn at a draw ratio of 3 to 6.

* * * * *